(12) United States Patent
Choi et al.

(10) Patent No.: US 6,506,525 B2
(45) Date of Patent: Jan. 14, 2003

(54) METHOD OF REPAIRING AN OPAQUE DEFECT IN A PHOTOMASK

(75) Inventors: Yo-han Choi, Incheon (KR); Jin-min Kim, Suwon (KR)

(73) Assignee: Samsung Electronics Co., Ltd., Tokyo (JP)

( * ) Notice: Subject to any disclaimer, the term of this patent is extended or adjusted under 35 U.S.C. 154(b) by 92 days.

(21) Appl. No.: 09/816,364

(22) Filed: Mar. 26, 2001

(65) Prior Publication Data

US 2001/0051303 A1 Dec. 13, 2001

(30) Foreign Application Priority Data

Jun. 1, 2000 (KR) .............................. 00-30036

(51) Int. Cl.$^7$ ................................. G03F 9/00
(52) U.S. Cl. ........................... 430/5; 430/314; 430/316; 216/12
(58) Field of Search ........................ 430/5, 314, 316; 216/12

(56) References Cited

U.S. PATENT DOCUMENTS

| 5,272,116 A | 12/1993 | Hosono ...................... 437/228 |
| 5,569,392 A | 10/1996 | Miyoshi et al. ............... 216/60 |

FOREIGN PATENT DOCUMENTS

| KR | 1994-0011731 | 12/1994 |
| KR | 2000-0003722 | 1/2000 |

*Primary Examiner*—Christopher G. Young
(74) *Attorney, Agent, or Firm*—Volentine Francos, PLLC

(57) ABSTRACT

A three-step method is used to repair an opaque defect in a photomask having a transparent substrate, and a light transmission portion disposed on the substrate and defining an opening the image of which is to be transferred to a layer on a semiconductor substrate. First, the thickness of the opaque defect is reduced by etching away only some of the defect. Second, a correction film is selectively formed over the entire surface of the substrate of the photomask in the opening defined by the light transmission portion with the exception of the region occupied by the pre-etched defect. Next, the correction film and the pre-etched defect are simultaneously etched away.

7 Claims, 8 Drawing Sheets

METHOD OF REPAIRING AN OPAQUE DEFECT IN A PHOTOMASK

BACKGROUND OF THE INVENTION

1. Field of the Invention

The present invention relates to a method of repairing a defect in a photomask. More particularly, the present invention relates to a method of repairing an opaque defect in the region of a photomask defining an opening through which exposure light is transmitted.

2. Description of the Related Art

The fabricating of an integrated circuit generally includes a plurality of photolithography processes that form circuit elements on the surface of a semiconductor substrate. A high quality photomask is a prerequisite for highly reliable photolithography. In particular, a photomask must have no defects and must be able to define a fine pattern on a semiconductor substrate in order to form a highly-integrated circuit. Typical defects in photomasks can be generally classified as either clear or opaque defects. A clear defect refers to damage in the portion of the photomask that defines the pattern that is to be reproduced on the substrate. On the other hand, as shown in FIG. 1, an opaque defect 30 refers to the presence of a film of light shielding material or phase shifting material on a light transmission portion 25 defining an opening through which light should pass. The opening is defined by a light shielding material pattern or a phase-shifting material pattern 20 formed on a transparent substrate 10.

The prevailing method for repairing the opaque defect uses a focused ion beam (FIB). In this method, the opaque defect 30 is etched and removed by projecting an FIB 40 onto the opaque defect 30 only, as shown in FIG. 2.

However, as shown in FIG. 3, when the opaque defect 30 is removed by the FIB, a recess (R) is formed in the substrate 10 along the edge of the opaque defect. The recess (R) is created because the region of the substrate 10 at the edge of the opaque defect 30 is also exposed tot eh FIB while the opaque defect is being etched. The recess (R) becomes even worse when the sidewall of the opaque defect 30 is not completely perpendicular but is inclined as shown in FIG. 2. Also, the recess (R) becomes deeper when an etching process is performed to remove an ion stain formed when the ions used to etch the opaque defect remain on the surface of the substrate 10 in the light transmission portion 25. Accordingly, a large step difference (d) is created in the light transmission portion 25 between a normal substrate region and the region of the substrate where the defect existed.

Therefore, when photolithography is performed using a photomask repaired by the conventional method, light is scattered by the recess (R), and a phase shift is produced due to the step difference (d). This reduces the transmissivity of the light transmission portion 25. This phenomenon becomes more serious in the case of a photomask that must have a constant light transmissivity characteristic and a small critical dimension (CD). Therefore, in many cases, it is almost impossible to use photomask repaired by the conventional method.

SUMMARY OF THE INVENTION

An object of the present invention, therefore, is to provide a method of repairing a defect in a photomask, which minimizes the forming in the light transmission portion of a step between a normal area of the substrate and the area where the defect was formed, and which prevents a recess from being formed in the substrate within the light transmission portion.

To achieve this object, the method of the present invention includes a pre-etching step, a correction film formation step, and a final etching step. In the pre-etching step, the thickness of the opaque defect is reduced by etching away only some of the opaque defect. In the correction film formation step, a correction film is selectively formed over the entire surface of the substrate within the light transmission portion with the exception of the region on which the pre-etched defect resides. In the final etching step, both the correction film and the pre-etched opaque defect are completely removed by performing an etching process over only the light transmission portion.

Preferably, the entire region of the light transmission portion is etched in the pre-etching step. Also, the light transmission portion is rectangular, and the final etching step is preferably performed by scanning the light transmission portion over a rectangular area corresponding to the shape of the light transmission portion. In this way, the corners of the light transmission portion are squared off, if necessary, to maximize the transmissivity of the photomask.

BRIEF DESCRIPTION OF THE DRAWINGS

The above and other object, features and advantages of the present invention will become more apparent by referring tot he following detailed description of the preferred embodiments thereof made with reference to the attached drawings, of which:

FIGS. 5A through 7B show the steps in the method of repairing a defect in a photomask according to the present invention, wherein FIGS. 5A, 6A and 7A are cross-sectional views of the photomask and FIGS. 5B, 6B and 7B are perspective views of the photomask;

FIGS. 11A through 11D are graphs showing the measured critical dimensions (CD) of contact holes, respectively, which are formed using normal photomasks and photomasks repaired by a method according to the present invention, wherein FIG. 11A, FIG. 11B, FIG. 11C and FIG. 11D show CDs of contact holes formed using 0.36 μm, 0.33 μm, 0.30 μm and 0.27 μm contact hole-defining photomasks, respectively.

DETAILED DESCRIPTION OF THE PREFERRED EMBODIMENTS

Figure 1:
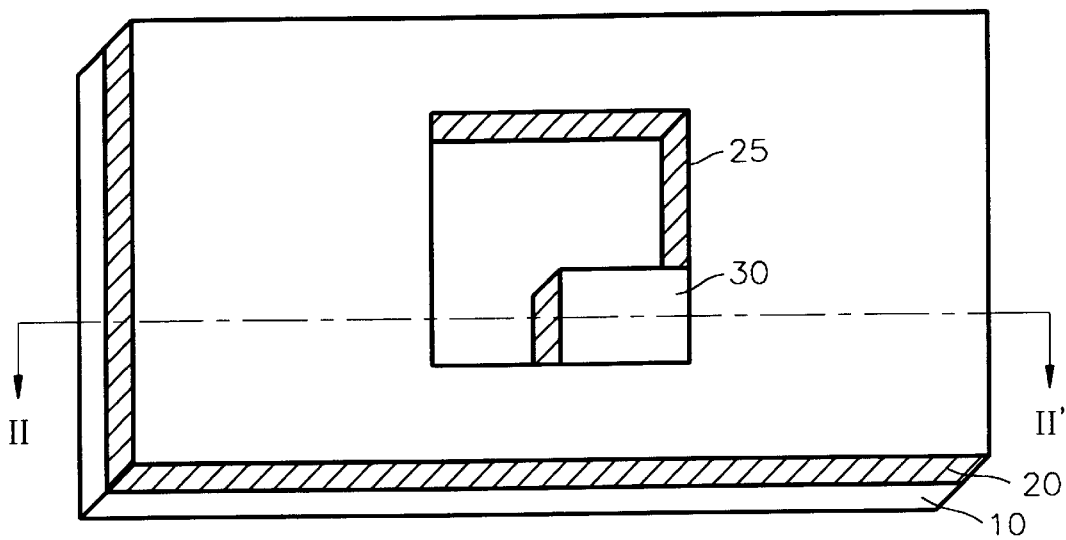
FIG. 1 is a perspective view of a photomask having an opaque defect.
Figure 2:
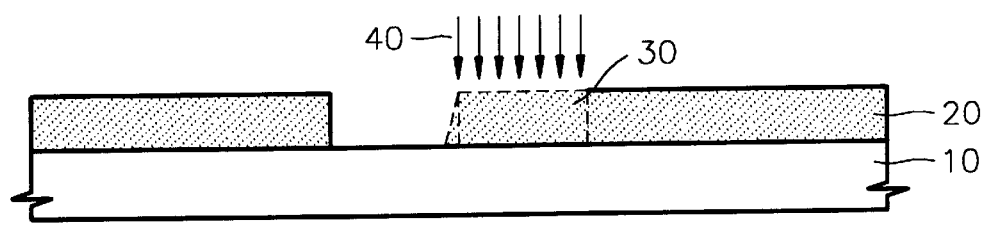
FIGS. 2 and 3 are cross-sectional views taken along line II–II' of FIG. 1, and illustrate a conventional method of repairing an opaque defect in the photomask shown in FIG. 1.
Figure 3:
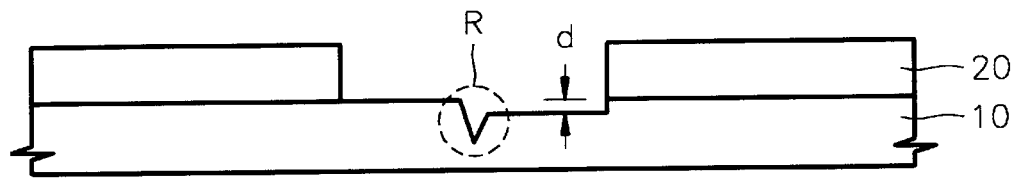

The present invention will now be described in detail with reference to the attached drawings. In the drawings, the thicknesses of layers or regions and the size of a light transmission portion are exaggerated for the sake of clarity. Also, like reference numerals designate like elements throughout the drawings. Furthermore, the term "focused ion beam (FIB)" used throughout the specification refers to an ion beam shaped by an electromagnetic field such as a focusing electromagnetic field or a collimating electromagnetic field.

Figure 4:
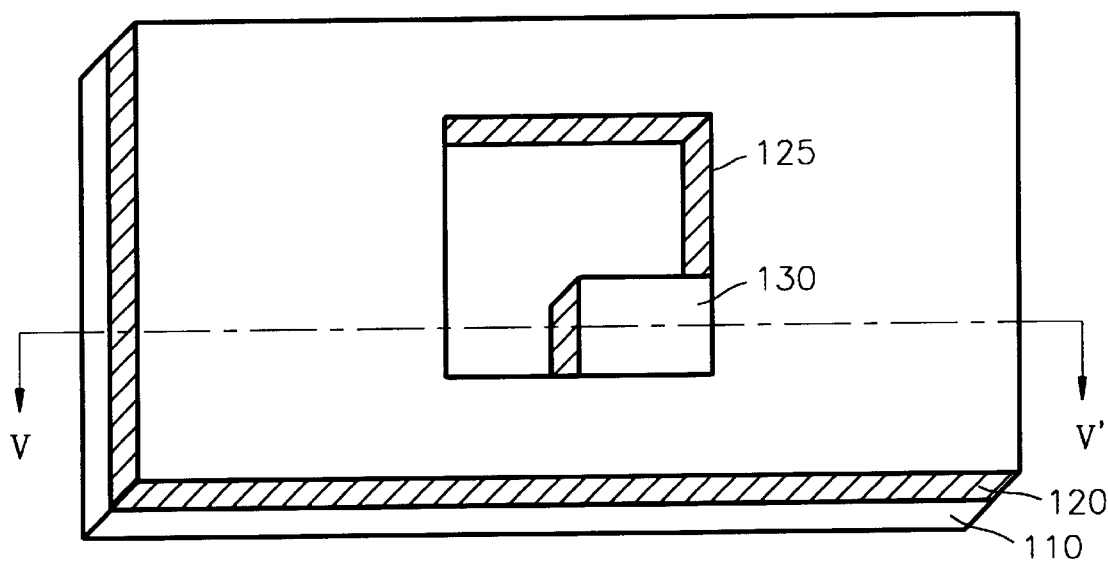
FIG. 4 is a perspective view of a photomask having an opaque defect that is to be repaired by a method according to the present invention.

FIG. 4 shows a photomask having an opaque defect 130 that is to be repaired by a repair method according to the present invention. The photomask comprises a photomask substrate 110, and a material film pattern 120 having a light transmission portion 125. The light transmission portion 125 in turn defines an opening of a predetermined size. An image of the opening can be formed on a semiconductor substrate by projecting light through the light transmission portion 125. An undesired opaque defect 130 is present within the light transmission portion 125.

The photomask substrate 110 is formed of a transparent material, e.g., quartz or glass. The material film pattern 120 is formed of a light shielding material in the case of a typical photomask, or a phase shifting material in the case of a phase shift photomask. More specifically, material having a low light transmissivity of 5% or less, e.g., chromium, molybdenum or aluminum, can be used as the light shielding material. CrO, CrON, CrOCN, MoSiO, MoSiON or WSix can be used as the phase shifting material.

A defect in the photomask can be detected by comparing the fabricated photomask with a model photomask. More specifically, the presence of a defect can be detected for by a direct or indirect method.

In the indirect method, a photoresist is formed on a wafer. The photoresist is then patterned using the previously-fabricated photomask. An image of the photoresist pattern is compared with that of a photoresist pattern formed using the model photomask, by a device such as a scanning electron microscope, to determine the presence and position of any defects. If a defect is detected, the coordinates of the defect are recorded, and the photomask is set within a photomask repairing device and positioned according tot he coordinates of the defect. However, in this method, only defects of a type that are transferrable to the photoresist can be detected.

Figure 5A:
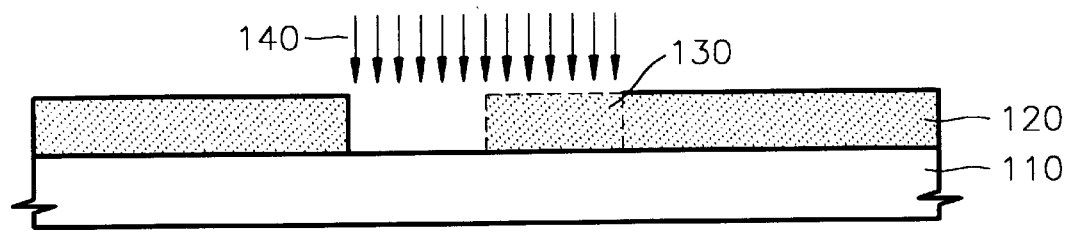

In the direct method, a detecting device can be separate from or integrated with the repairing device. For example, in an FIB apparatus in which a defect detecting device and a defect repairing device are integrated, an ion beam emitted from a metal ion source, e.g., a gallium (Ga) ion source, is projected onto a photomask. Secondary charged particles (secondary electrons, secondary ions, etc.) emitted from the photomask are captured by a detector, thereby forming a scanned ion image. The scanned ion image is compared with a stored model image to determine the presence and position of any defects. A region having a detected defect is then positioned under an ion beam radiating unit using data produced by the comparison of the scanned ion image with the stored model image. That is, when the coordinates of an opaque defect are ascertained by the FIB apparatus, first, an area in which the opaque defect 130 exists is placed under an FIB radiating unit, as shown in FIG. 5A.

Figure 5B:
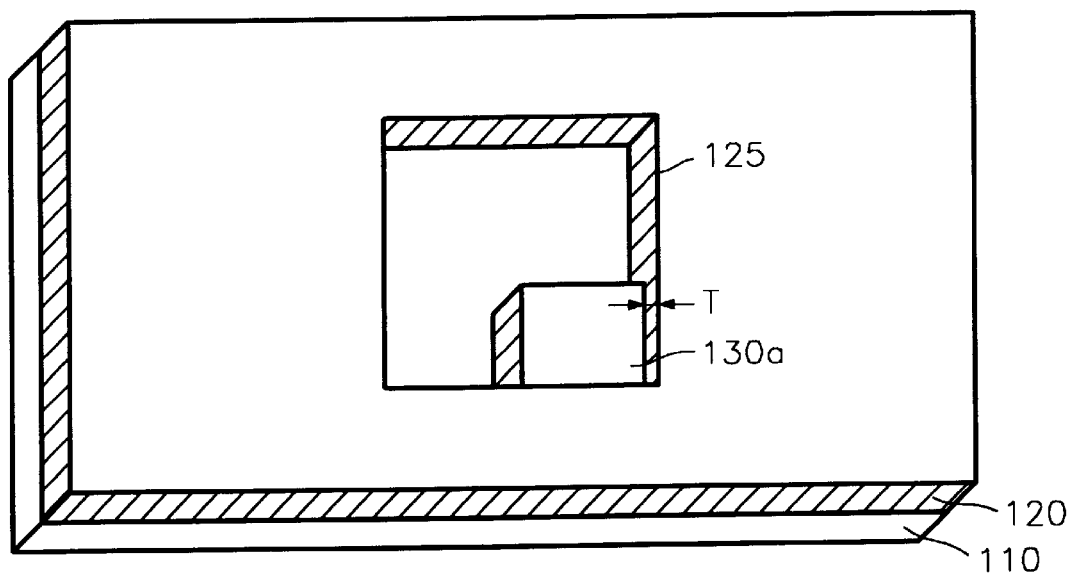

According to the present invention, once the area in which the opaque defect 130 exists is positioned under the FIB radiating unit, an FIB 140 is projected onto the opaque defect 130 to pre-etch the opaque defect 130. As shown in FIG. 5B, the pre-etching step is performed to reduce the thickness of the opaque defect 130.

In the pre-etching step, preferably the entire region of the light transmission portion 125, including the opaque defect 130, is irradiated with the FIB to provide a larger etching margin compared to the case of trying to etch only the opaque defect 130. This does, however, damage the region of the substrate 110 where no opaque defects are present. Nonetheless, such damage can be compensated for in a final etching process. The thickness T of the material of the opaque defect 130 removed by the pre-etching process is predetermined in consideration of the subsequent correction film deposition process (described next) and the ability to control the process parameters of the final etching process. In typical applications, the reduced thickness T is equal to or less than $\frac{1}{5}$ the thickness of the opaque defect 130.

Figure 6A:
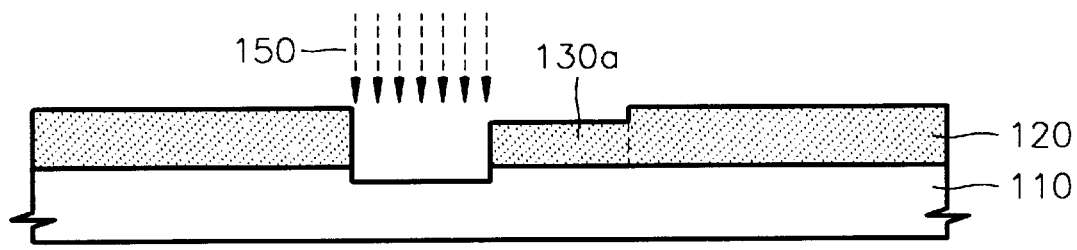
Figure 6B:
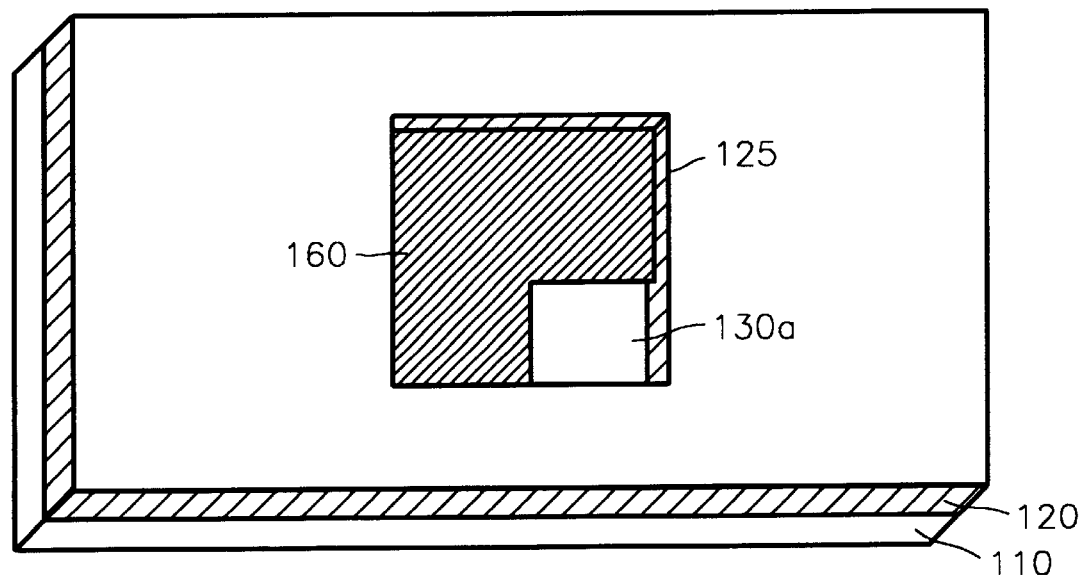

As just mentioned above, a correction film deposition process is performed after the pre-etching of the opaque defect is completed. In the correction film deposition process, as shown in FIG. 6A, a predetermined material 150 is deposited over the light transmission portion 125 except at the region where the pre-etched defect 130a resides. Thus, a correction film 160 (FIG. 6B) is formed. The correction film deposition process is preferably an FIB-induced deposition process.

Although not shown, the correction film 160 overlaps the opaque defect 130 to some extent due to limits in the image resolution of the FIB apparatus and the accuracy of the deposition process. Thus, if the opaque defect 130 were removed by an FIB after the correction film 160 was formed and without pre-etching the opaque defect 130 to reduce the thickness thereof, the edges of the opaque defect would remain on the light transmission portion 125. Therefore, the thickness of the opaque defect 130 must be reduced before the correction film 160 is formed.

Figure 7A:
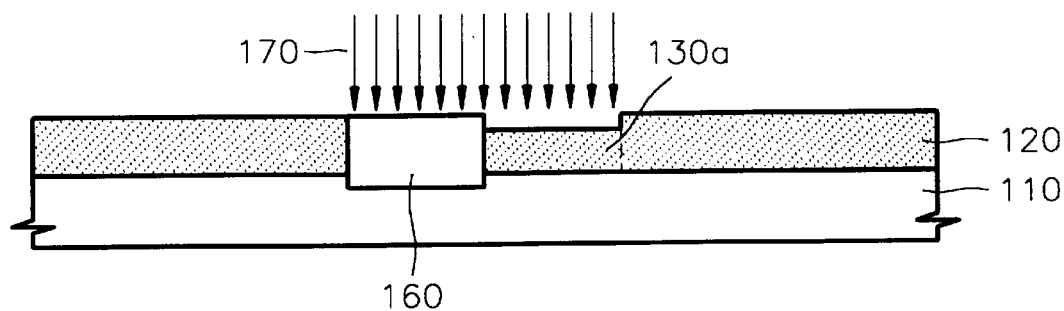
Figure 7B:
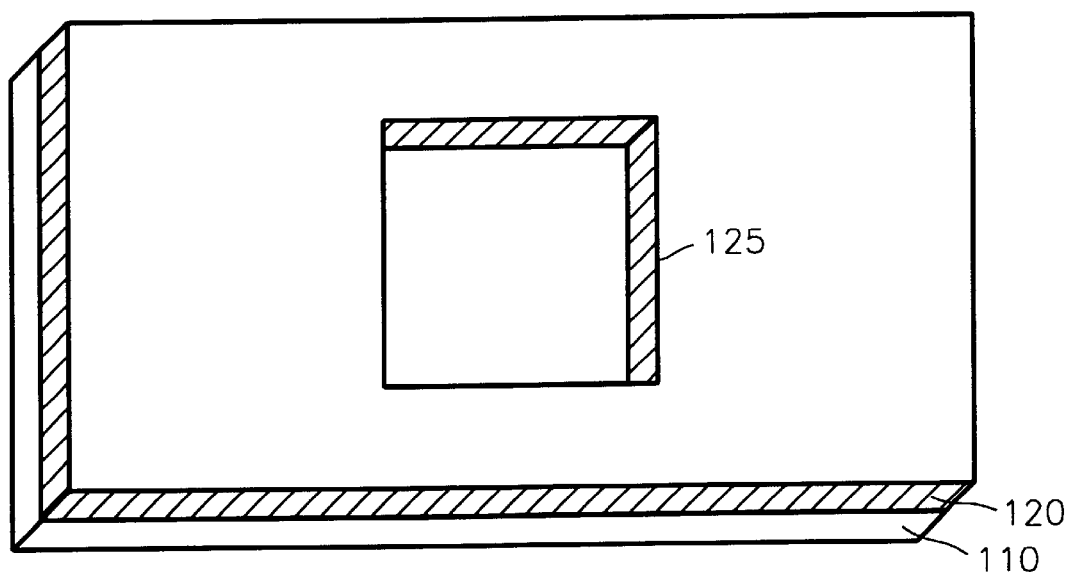

Next, as shown in FIG. 7A, a final etching process is performed by irradiating the entire light transmission portion 125 with an FIB 170, thereby simultaneously removing the pre-etched opaque defect 130a and the correction film 160. As a result, the surface of the substrate has no step differences, as shown in FIG. 7B. That is, no recess in the light is produced in the light transmission portion 125, in contrast to the prior art repair method.

The etch rate and thickness of the correction film 160 are designed for in consideration of the etch rate and thickness of the pre-etched opaque defect 130a. Appropriately selecting the etch rate and designing for the thickness of the correction film 160 leads to a complete and simultaneous removal of the pre-etched opaque defect 130a and the correction film 160 from the substrate by the subsequent final etching process, and a minimization of the step difference between the normal substrate area and the substrate area where the defect resided. Preferably, the correction film 160 is formed of a material having an etch rate within a range of from 1 to 1.5 times the etch rate of the material film pattern 120. When the material film pattern 120 is formed of chromium, the correction film 160 can be formed of carbon 150.

The light transmission portion is usually rectangular because the opening defined by the light transmission portion is usually used to form a contact hole or via hole. Hence, the final etching step is preferably performed by scanning the rectangular light transmission portion with an FIB. Scanning the light transmission portion with an FIB over a rectangular area as described above also corrects any damage to the surface of a substrate created during the pre-etching process. The final etching process is thus also designed to compensate for any reduction in the light transmissivity of the photomask caused by the previous step of pre-etching the opaque defect 130.

Moreover, a typical light transmission portion is not perfectly rectangular; rather its four corners are rounded due to limits in the ability to shape the light used to pattern the material film in the forming of the light transmission portion of the photomask. In this case, the light transmissivity of the photomask is reduced by an amount corresponding to the rounded corners of the light transmission portion.

Now, when a defect has been repaired according to the present invention, the light transmission portion becomes perfectly rectangular because the light transmission portion is scanned over a rectangular area with an FIB during the final etching process. That is, the FIB squares the rounded corners of the light transmission portion in addition to removing the pre-etched opaque defect 130a and the correction film 160 from the substrate 110. Accordingly, light can be transmitted through the four corner portions of the light transmission portion, as opposed to the case of a photomask that does not undergo the repair method of the present invention. Consequently, the light transmissivity of a photomask repaired according to the present invention is greater than or equal to the light transmissivity of a normal photomask, i.e., a photomask that was formed free of any opaque defects to begin with.

Next, ion stains are removed from the surface of the substrate 110 using a cleaning solution. In this step, the surface of the substrate 110 exposed by the opening of the light transmission portion 125 is slightly over-etched. Nonetheless, the over-etching does not change the light transmissivity of the photomask.

The present invention will now be described in more detail with reference to the following experimental examples.

Experimental Example 1

Three photomasks were produced having a 700 Å-thick opaque defect within the light transmission portion thereof. Each light transmission portion was designed to produce a 1.0 $\mu$m×1.0 $\mu$m contact hole image.

As for one photomask, the entire light transmission portion was irradiated with an FIB at a dose of 0.1 nC/$\mu$m$^2$ according to the repair method of the present invention, thereby reducing the thickness of the opaque defect by about 100 Å. Then, a correction film was formed using an FIB apparatus by depositing a carbon film on the region of the light transmission portion other than that where the pre-etched defect resided. Next, the entire light transmission portion was scanned in a rectangular area with an FIB at a dose of 0.35 nC/$\mu$m$^2$, to thereby completely remove the pre-etched defect and the correction film from the light transmission portion. Subsequently, an AFM image of the repaired photomask is shown in FIG. 8.

As for another photomask, the defect was repaired by irradiating only the opaque defect with an FIB at a dose of 0.5 nC/$\mu$m$^2$ according to a conventional method, to thereby completely remove the opaque defect at once. An AFM image of the photomask repaired this way is shown in FIG. 9.

As for the other photomask, without pre-etching the defect, a carbon film was formed as a correction film on a region of the light transmission portion excluding that where the opaque defect reside. The defect and the correction film were then removed by scanning the entire light transmission portion with an FIB at a dose of 0.35 nC/$\mu$m$^2$. Subsequently, an AFM image was taken of the photomask repaired in this way. The AFM image is shown in FIG. 10.

Figure 8:
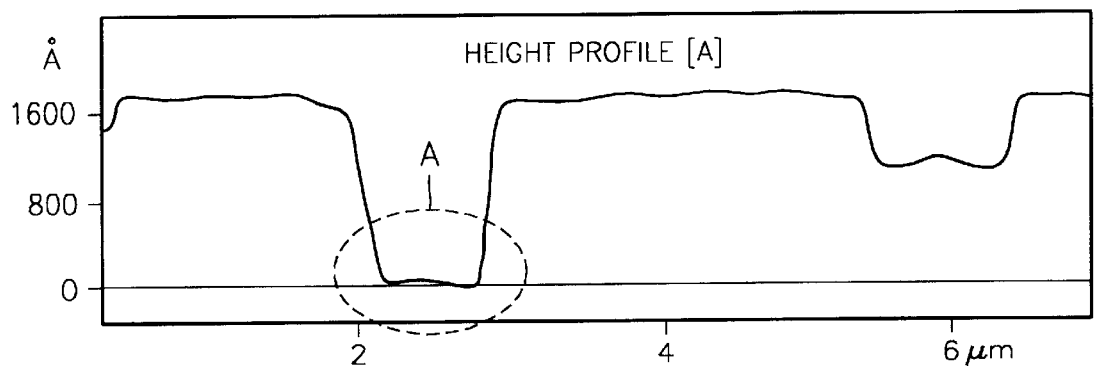
FIG. 8 is a diagram of an atomic force microscope (AFM) image of a photomask repaired according to the present invention.

As shown by region A in FIG. 8, an opaque defect repaired by the method of the present invention is completely removed without any step difference being produced in the substrate within the light transmission portion.

Figure 9:
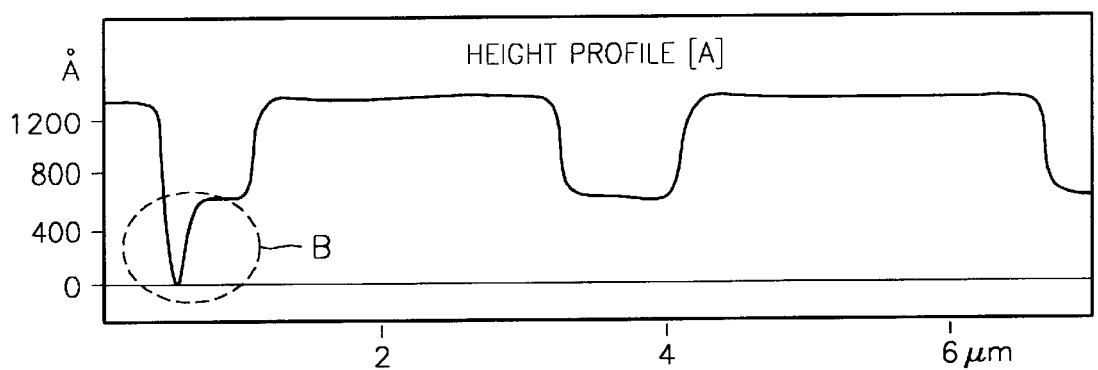
FIG. 9 is a diagram of an AFM image of a photomask repaired by a conventional method.

On the other hand, as region B in FIG. 9 shows, a defect having a form similar to that of a river bed, i.e. a recess in the substrate, is created when a photomask is repaired by the conventional method.

Figure 10:
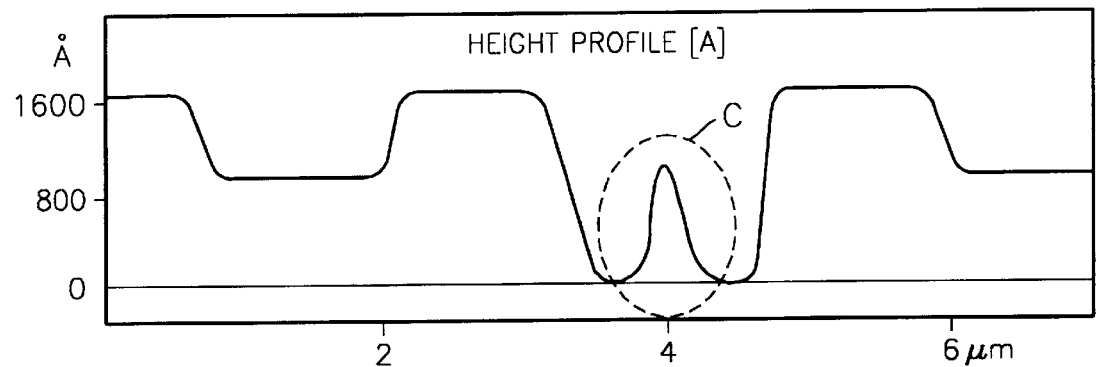
FIG. 10 is a diagram of an AFM image of a photomask repaired by depositing a correction film and etching only the correction film instead of the entire surface of a substrate.

Also, as shown at region C in FIG. 10, a portion of the opaque defect remains on the substrate within the light transmission portion when the light transmission portion is etched only after the correction film is formed, i.e. without pre-etching the opaque defect.

Thus, Experimental Example 1 evidences that an opaque defect can be completely removed only through the sequential pre-etching, forming of a correction film, and final etching steps of the present invention are performed. In addition, Experimental Example 1 evidences that no step differences are created in the substrate within the light transmission portion when the method of the present invention is performed to correct an opaque defect.

Experimental Example 2

Photomasks were produced each having a of 1.44 $\mu$m×1.44 $\mu$m light transmission portion. Each of the light transmission portions was configured to form a 0.36 $\mu$m×0.36 $\mu$m contact hole in a semiconductor substrate. Opaque defects within the light transmission portions were repaired according to the method of the present invention used in Experimental Example 1. Then, photoresist patterns were formed by photolithography using the repaired photomasks.

More specifically, first, a 1 $\mu$m thick photoresist film was formed on each of a plurality of wafers. Then, three of the photoresist films were exposed using the photomask repaired according to the present invention, and an i-line stepper (numerical aperture: 0.65, σ:0.52) as an exposure source, at focuses of 0, ±0.2 $\mu$m, and ±0.4 $\mu$m, respectively. Then, the exposed photoresist films were developed.

Also, three other photoresist films were exposed using a normal (defect-free) mask that defined the same pattern as the repaired mask, and an i-line stepper (numerical aperture: 0.65, σ:0.52) as an exposure source at focuses of 0, ±0.2 $\mu$m, and ±0.4 $\mu$m respectively. These photoresist films were also then developed to form photoresist film patterns.

Figure 11A:
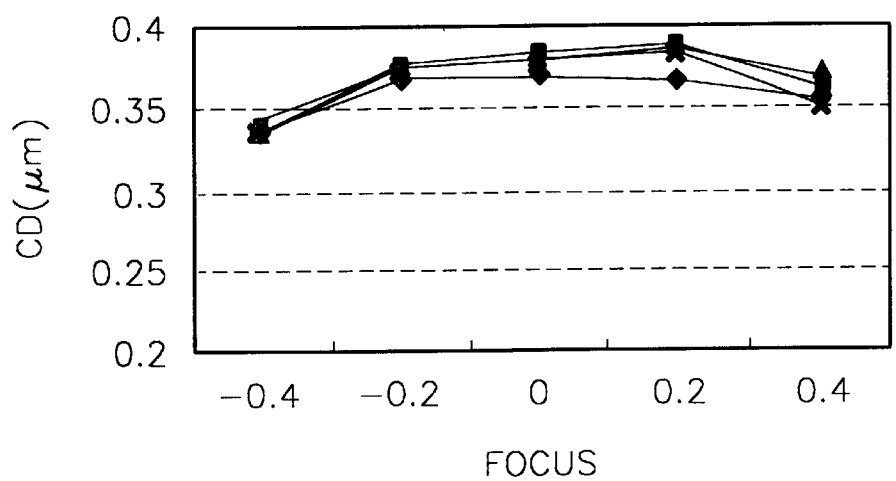

That is, a plurality of photoresist patterns defining contact holes were formed. The critical dimensions of the contact holes defined by the photoresist patterns were measured. The results of the measurements are shown in FIG. 11A. In FIG. 11A, the symbol—◆—represents a contact hole formed using the normal mask, and the symbols—■—, —▲—, and —X—represent contact holes formed using the light transmission portions, respectively, of the first, second and third photomasks repaired according to the method of the present invention. As can be seen from FIG. 11A, the photomasks repaired by the method of the present invention have the same focus margins as that of a normal photomask, and the deviation between the critical dimensions of the contact holes formed using the normal mask and the repaired masks is within 10 nm. This shows that there were no step differences produced at the surfaces of the substrates of the photomasks repaired according to the method of the present invention. This also shows that the transmissivity of a photomask is not reduced by repairing the photomask according to the present invention, i.e., that the final etching process performed by scanning the light transmission portion with an FIB over a rectangular area compensates for any previous degradation in the light transmissivity of the light transmission portion.

Figure 11B:
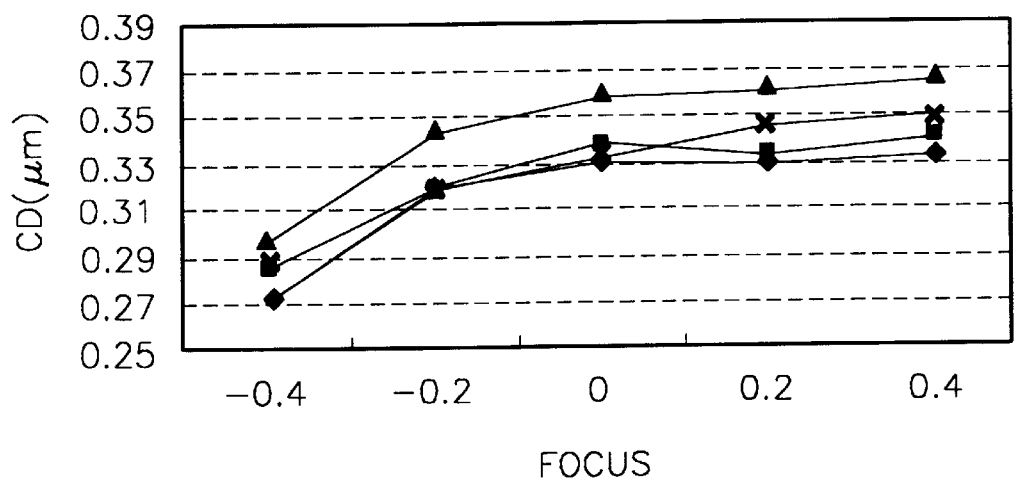
Figure 11C:
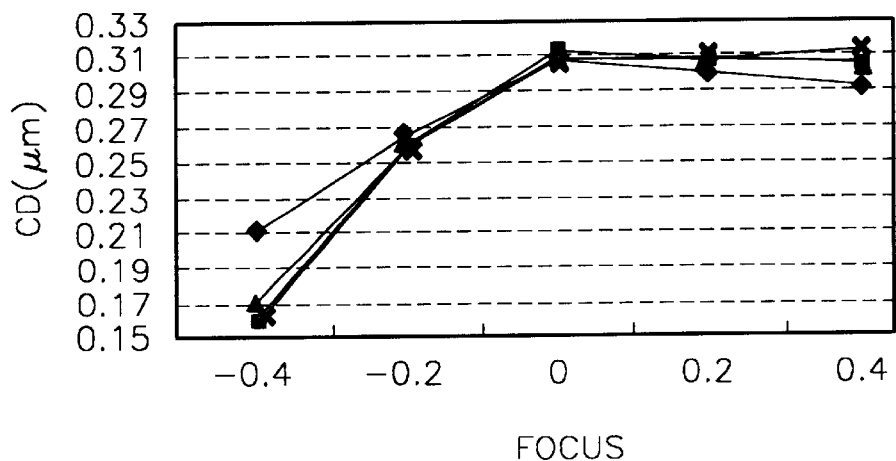
Figure 11D:
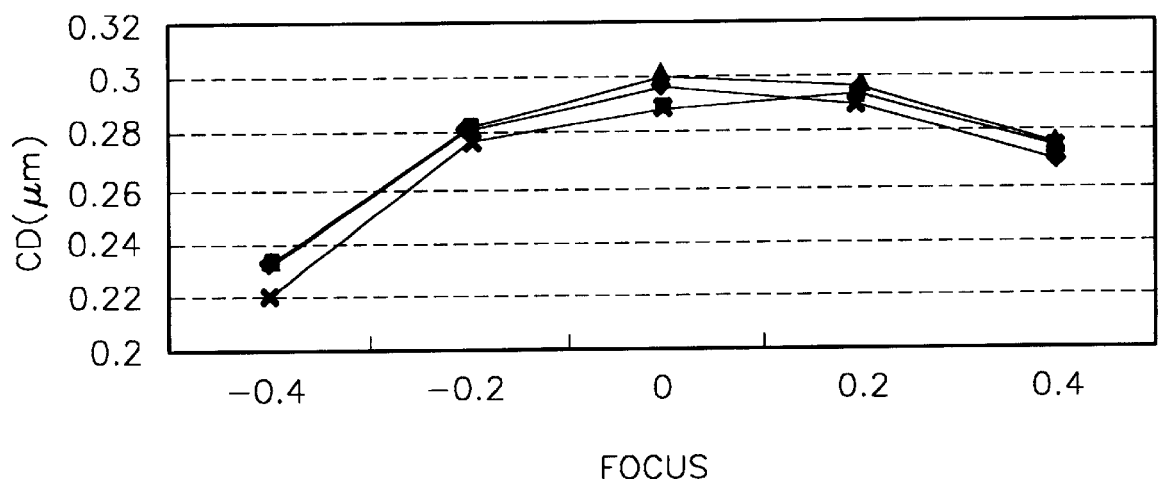

FIGS. 11B through 11D are graphs showing the CDs of contact holes formed by the same method described above in achieving the results of FIG. 11A, except that photomasks configured to form 0.33 μm×0.33 μm, 0.30 μm×0.30 μm, and 0.27 μm×0.27 μm contact holes were used. As can be seen from FIGS. 11B through 11D, the repair method of the present invention also completely removes opaque defects in photomasks used to form small contact holes, and the light transmissivity of the repaired photomasks is almost the same as that of a normal photomask.

In summary, the present invention removes an opaque defect from a photomask by a three-step process including a pre-etching step, a correction film formation step, and a final etching step. The pre-etching step prevents any part of the defect from remaining on the surface of the substrate within the light transmission portion. The correction film and the defect are simultaneously removed by etching the entire region of the light transmission portion. Accordingly, no step differences are created at the surface of the substrate within the light transmission portion. Also, the light transmissivity of a photomask repaired according to the present invention is substantially the same as that of a normal photomask, especially when the final etching process is performed by scanning the light transmission portion over a rectangular area with an FIB.

Therefore, when photolithography is performed using a photomask repaired by the method of the present invention, a photoresist pattern having a desired critical dimension and an excellent profile can be formed.

The present invention has been described above in connection with the preferred embodiments thereof. However, various changes to and modifications of the present invention will become readily apparent to those of ordinary skill in the art. Therefore, all such changes and modifications are seen to be within the true spirit and scope of the present invention as defined by the appended claims.

What is claimed is:

1. A method of repairing a photomask having a substrate that is transparent to light, a patterned film of material disposed on the substrate and having a light transmission portion defining an opening the image of which is to be transferred by projecting light through the light transmission portion, and an opaque defect formed of the material of the patterned film and located on the surface of the substrate within the opening defined by the light transmission portion, the method comprising:

etching away only some of the opaque defect to reduce the thickness of the opaque defect, whereby the opaque defect is pre-etched;

subsequently selectively forming a correction film over the entire surface of the substrate in the opening defined by the light transmission portion except for over that portion of the surface occupied by the pre-etched defect; and subsequently etching away both the correction film and the pre-etched opaque defect in the light transmission portion in a final etching process, whereby the correction film and the pre-etched opaque defect are completely removed.

2. The method of claim 1, wherein said etching away of only some of the opaque defect comprises performing an etching process over the entire region of the light transmission portion.

3. The method of claim 1, wherein said etching away of only some of the opaque defect reduces the thickness of the opaque defect by an amount no greater than ⅕ the original thickness of the opaque defect.

4. The method of claim 1, wherein said forming of a correction film comprises forming a correction film on the surface of the substrate of a material having an etch rate that is 1 to 1.5 times greater than the etch rate of the material film, with respect to said final etching process.

5. The method of claim 4, wherein said forming of a correction film comprises forming a film of carbon on the surface of the substrate.

6. The method of claim 1, wherein the light transmission portion is rectangular, and the final etching process comprises scanning the rectangular light transmission portion over a rectangular area, having the same overall size and shape as the light transmission portion, with an ion beam.

7. The method of claim 1, wherein the final etching process comprises scanning the light transmission portion with an ion beam, and further comprising removing ion stains that exist on the surface of the substrate after the final etching process is completed.

* * * * *